US006970031B1

(12) United States Patent
Martin et al.

(10) Patent No.: US 6,970,031 B1
(45) Date of Patent: Nov. 29, 2005

(54) METHOD AND APPARATUS FOR REDUCING CHARGE INJECTION IN CONTROL OF MEMS ELECTROSTATIC ACTUATOR ARRAY

(75) Inventors: Eric T. Martin, Corvallis, OR (US); Art Piehl, Corvallis, OR (US); Adam Ghozeil, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 29 days.

(21) Appl. No.: 10/855,359

(22) Filed: May 28, 2004

(51) Int. Cl.[7] .............................................. H03K 17/30
(52) U.S. Cl. ....................... 327/382; 327/108; 327/309
(58) Field of Search ................................ 327/108, 109, 327/110, 111, 112, 309, 320, 325, 379, 380, 327/381, 382, 384, 389

(56) References Cited

U.S. PATENT DOCUMENTS

| | | | | |
|---|---|---|---|---|
| 4,670,861 | A | | 6/1987 | Shu et al. |
| 5,479,121 | A | * | 12/1995 | Shen et al. .................... 327/94 |
| 5,650,744 | A | | 7/1997 | Oh |
| 5,739,720 | A | | 4/1998 | Lee |
| 6,075,400 | A | * | 6/2000 | Wu et al. ................... 327/382 |
| 6,320,394 | B1 | | 11/2001 | Tartagni |
| 6,342,700 | B1 | | 1/2002 | Izumi et al. |
| 6,437,583 | B1 | | 8/2002 | Tartagni et al. |
| 6,522,187 | B1 | * | 2/2003 | Sousa ......................... 327/391 |
| 6,535,051 | B2 | | 3/2003 | Kim |
| 6,635,857 | B1 | | 10/2003 | Kindt |
| 6,781,434 | B2 | * | 8/2004 | Jensen et al. ............... 327/382 |

* cited by examiner

*Primary Examiner*—Jeffrey Zweizig

(57) ABSTRACT

A control circuit for a MEMS (Micro-Electro-Mechanical System) has a semiconductor switch which has a source, a drain and a gate, which is associated with a selected one of spatially arranged fixed and movable plates of a variable capacitor, and is arranged to selectively connect the selected one of the fixed and movable plates with a voltage source. A charge injection control circuit is associated with the semiconductor switch and attenuates current injection into the selected one of the fixed and movable plates of the capacitor.

20 Claims, 12 Drawing Sheets

METHOD AND APPARATUS FOR REDUCING CHARGE INJECTION IN CONTROL OF MEMS ELECTROSTATIC ACTUATOR ARRAY

BACKGROUND OF THE INVENTION

The present invention relates generally to a MEMS (Micro-Electro-Mechanical Systems) and more specifically to a control arrangement for a MEMS actuator which reduces charge errors and which allows more precise control of the MEMS actuator position and increases control range.

When a MOS (Metal Oxide Semiconductor) switch turns off, charge injection errors occur by way of two mechanisms. The first is due to channel charge, which must flow out from the channel region of the transistor to the drain and source junctions. The second charge is due to overlap capacitance between the gate and drain. These can induce drawbacks in MEMS devices wherein this charge can diminish the degree to which a gap in a device, such as variable capacitor, which is associated with the transistor and the control of the MEMS, can be accurately controlled. In the worst case, these effects can be sufficient to cause a capacitor to go into pull-in mode and undesirably snap down.

An arrangement which enables the charge injection into a MEMS variable capacitor to be diminished during MOS switch off is therefore necessary.

DETAILED DESCRIPTION OF THE EXEMPLARY EMBODIMENTS

Figure 1:
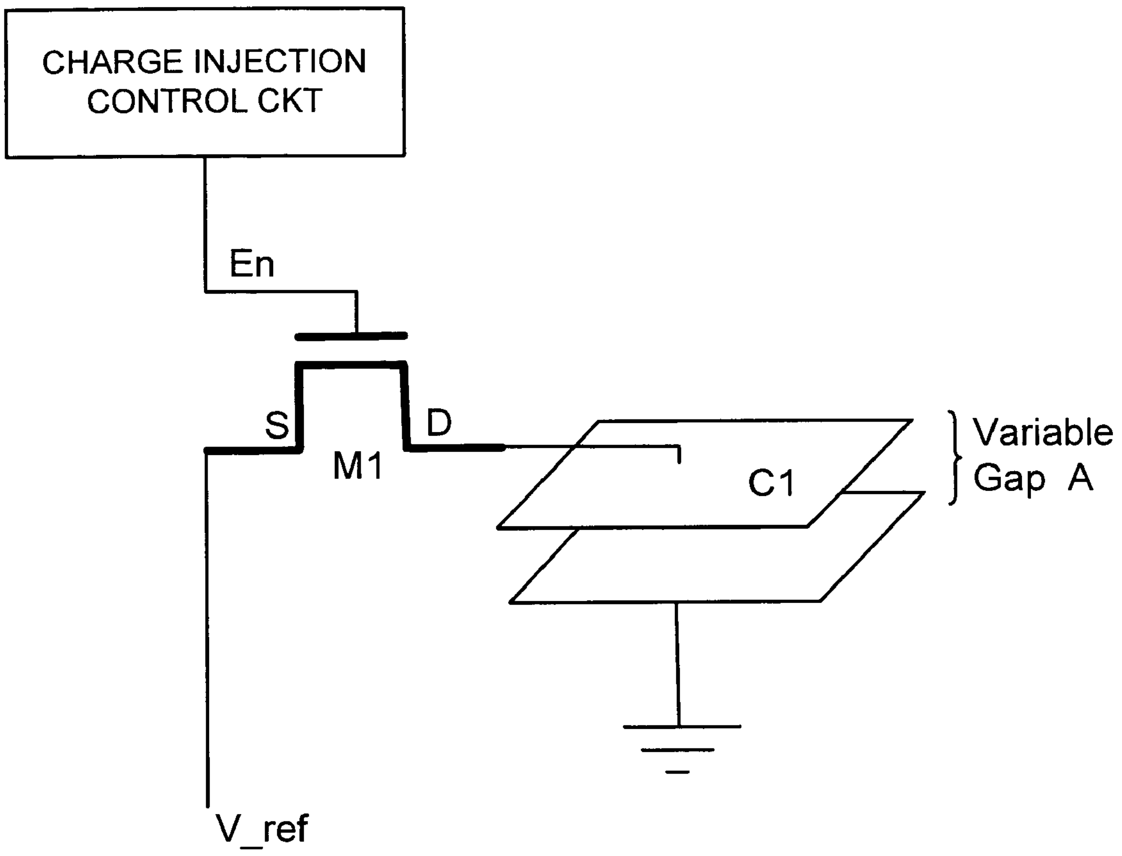
FIG. 1 is a schematic depiction of an embodiment of the invention showing a variable capacitor and a charge injection control circuit which is connected to the variable capacitor through a semiconductor device such as transistor and which controls the development of charge on the upper of the two electrodes.

The embodiments of the invention relate to accurately controlling the gap of a MEMs capacitor. FIG. 1 shows an embodiment of the invention. In this embodiment a variable capacitor C1 consists of a bottom fixed plate (which can be grounded), and a movable top plate which is suspended by flexure beams (not shown). The variable gap A between the two plates is controlled by controlling the charge on the upper or top plate. As shown, an injection control circuit is connected with the upper plate via a solid state switch.

In a nutshell this arrangement comprises a variable capacitor having a fixed plate and movable plate disposed in predetermined spatial relationship with respect to the fixed plate; and a semiconductor switch which has a source, a drain and a gate, which is associated with a selected one of the fixed and movable plates of the capacitor and which is arranged to selectively connect the selected one of the fixed and movable plates with a voltage source. A charge injection control circuit is associated with the semiconductor switch so as to attenuate current injection into the selected one of the fixed and movable plates of the capacitor.

In more detail, FIG. 1 C1 denotes the variable capacitor (flexures are not shown). M1 is an analog switch formed by an NMOS device, a PMOS device, or NMOS and PMOS devices. V_ref is an analog reference voltage. En is the enable signal which is generated by the charge injection control circuit. To “write” a charge to C1 and change Gap A, V_ref is established, and then M1 is turned on by En which is generated by the charge control circuit. After an appropriate time (a function of the circuit’s electrical time constant), M1 is turned off.

This process changes the amount of charge on C1 and induces the situation wherein the electrostatic charge which has accumulated on C1 draws the movable plate toward the fixed plate.

To produce an array of MEMS actuators, the circuit of FIG. 1 is replicated N×M times, in N rows and M columns. En could be a row signal, for a total of N En signals, and V_ref could be a column signal for M V_ref signals.

However, as noted above in connection with the prior art, significant error can be introduced into the system by the charge injected onto C1 by M1 when M1 is turned off. In the worst case, as noted above, this charge can be large enough to cause C1 to go into pull-in mode and snap down. Alternatively, this charge can simply diminish the level of control to which Gap A can be controlled.

When MOS switches turn off, charge errors occur by way of two mechanisms. The first is due to channel charge, which must flow out from the channel region of the transistor to the drain and source junctions. The second charge is due to overlap capacitance between the gate and drain. The embodiments of the invention described here minimize these sources of charge error.

In the case of an array of MEMS actuators, the die can consist of control circuitry which runs at low-voltage logic on the periphery of the array, while the array itself, may be required to operate at higher voltages. In this case, each En row signal may be voltage level-shifted from a low voltage (5 V, for example) output from the control logic to a high-voltage (12 V, for example) signal appropriate for the array by means of a high-voltage level shifter circuit.

In an array operating at 12 V (for example), the gates of the analog MOS switches in the array can experience voltage swings of 0–12 V, which can inject significant noise due to gate-drain coupling and channel charge injection. It is desired to limit the voltage swing on the gate of the MOS switch to reduce charge injection into the MEMS device. Embodiments that accomplish this are described below:

The first and second embodiments of the charge injection control circuit are directed to reducing charge injection in MEMS electrostatic actuators by decreasing gate voltage swing on the drive transistor. In a nutshell, these circuits comprise first and second semiconductor elements which are circuited with a gate of the semiconductor switches and which modify a gate signal which is applied to the gate in a manner wherein at least one of:

a) a voltage variation time of the gate signal is set so that current can predominantly drain from a channel of the semiconductor switch to the source when the semiconductor switch is closing, and b) the voltage of the signal which is applied to the gate is limited to limit the degree to which the semiconductor switch enters into an inversion region and/or an accumulation region.

Figure 2:
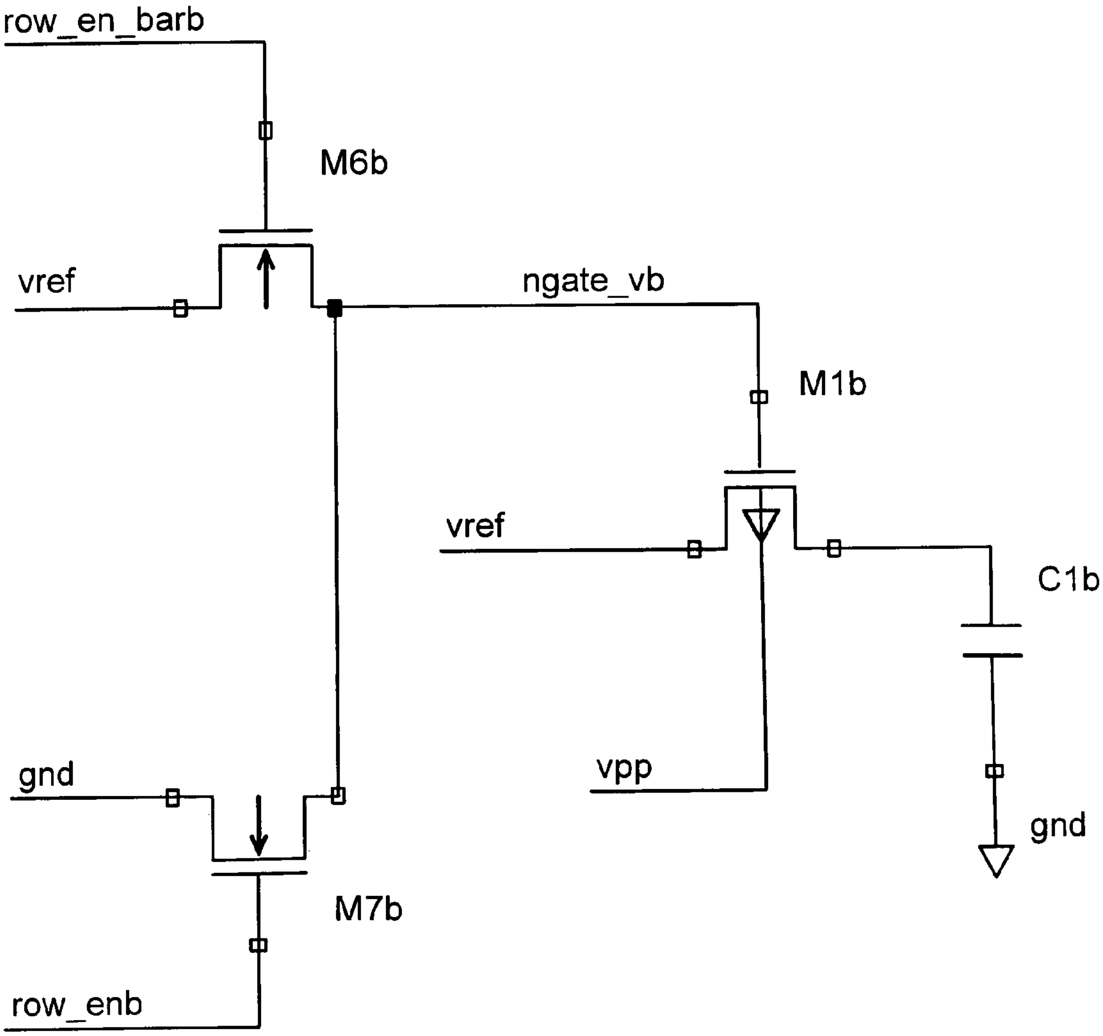
FIG. 2 is a circuit diagram showing a first embodiment of an injection control circuit which is applied to the arrangement illustrated in FIG. 1.

FIG. 2 shows details of the first embodiment of the charge injection control circuit. As will be appreciated, this embodiment requires the addition of two devices to each array subcircuit to limit the "off" gate voltage of the MOS switch and slow the switch closure to the degree that instead of the charge beneath the gate being permitted to distribute 50/50 between the source and the drain, most of the charge is, due to the differential capacitance between the source and drain, permitted to drain off to the source side.

In FIG. 2, M1*b* and C1*b* represent M1 and C1 of FIG. 1 respectively. M6*b* and M7*b* are used to condition the signal ngate_vb, which enables/disables MOS switch M1*b*. To turn on M1*b* (PMOS), M7*b* (NMOS) is activated by row_enb, a high-voltage signal. When M1*b* is on, the gate of M1*b* is driven to all the way to ground (0 V). To turn M1*b* off, instead of driving the gate of M1*b* to a full vpp, which would inject maximum coupling noise, the gate of M1*b* is only driven to vref by M6*b*. Because the source of M1*b* is at vref, a gate voltage of vref is the minimum voltage required to fully turn M1*b* off. Using an NMOS device for M6*b* has the added benefit of smoothing out (slowing) the turn-off voltage slope on ngate_vb, which reduces charge injection in M1*b* due to channel charge dispersion.

Figure 3:
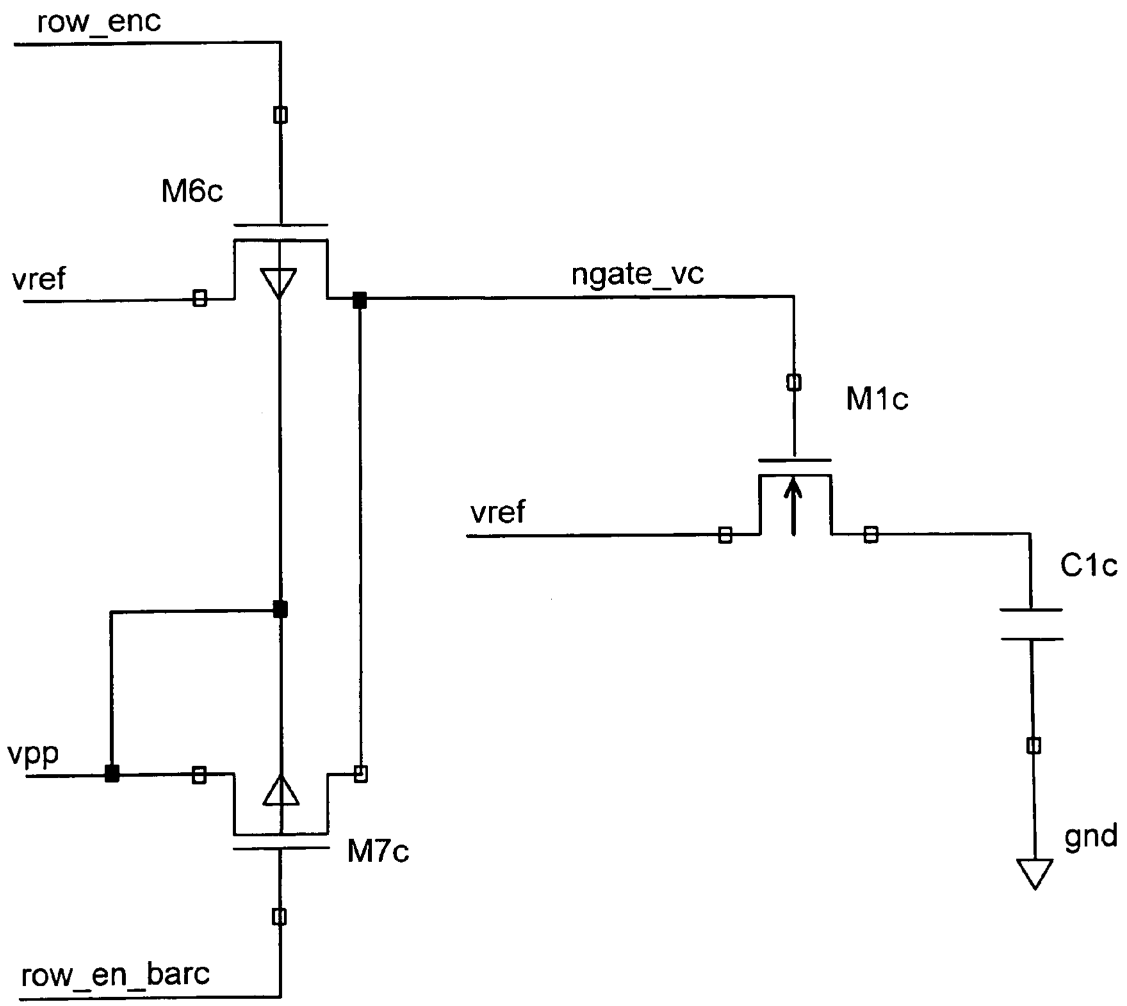
FIG. 3 is a circuit diagram showing a second embodiment of an injection control circuit.
Figure 6:
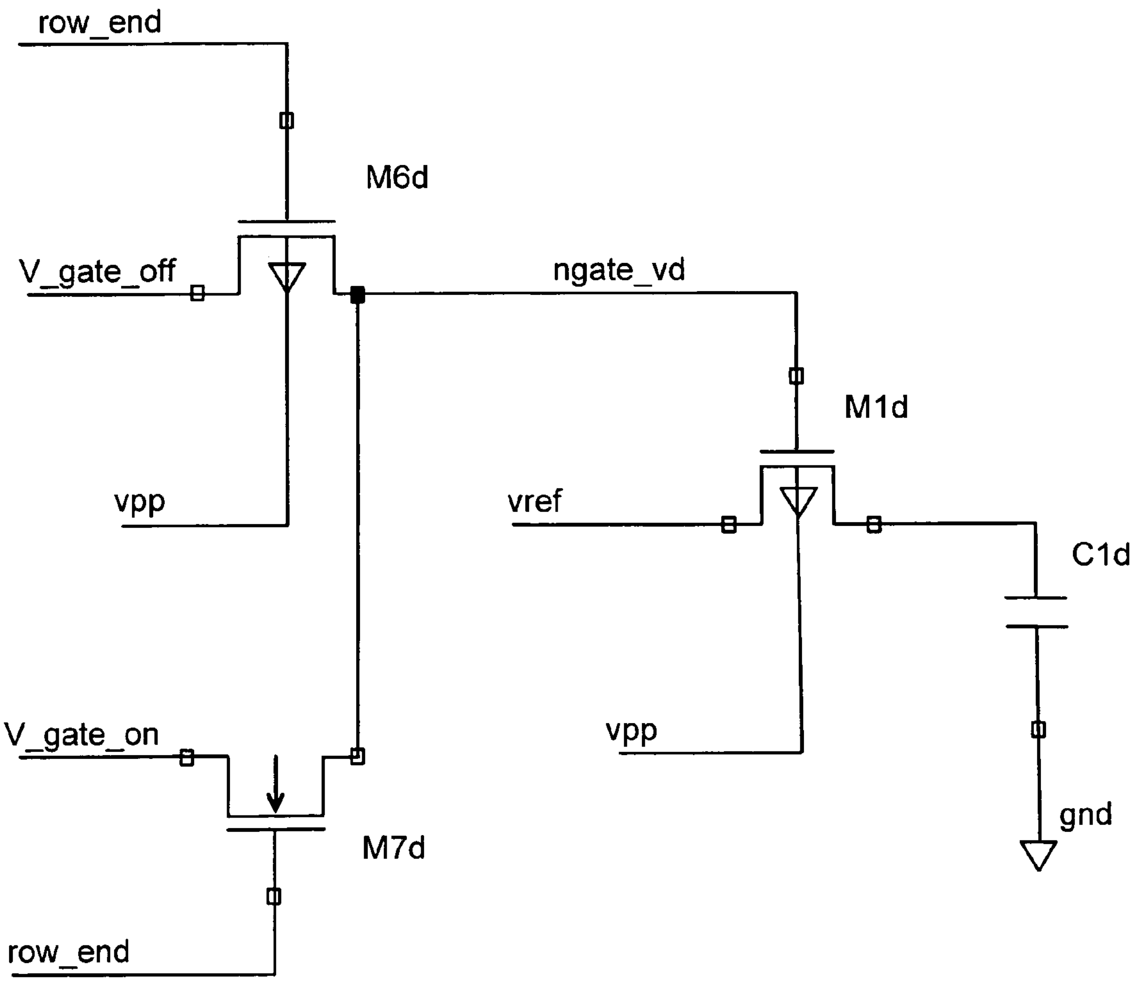
FIG. 6 is a circuit diagram showing a third embodiment of the injection control circuit.

FIG. 3 shows a second embodiment of the invention. This embodiment is also directed limiting the "off" gate voltage of the MOS switch and is such that M1*c* and C1*c* respectively represent M1 and C1 of FIG. 1. It will be noted that the signal/element designations which end in the letter "b" in FIG. 2 have corresponding designations wherein the letter "b" is replaced with the letter "c". In FIG. 6, the letter "b" is replaced by the letter "d". Thus, the high voltage signal row_enb in FIG. 2, becomes row_enc and row_end in FIGS. 3 and 6 respectively.

The signals row-en and row-en-bar are high voltage signals which are applied in accordance with the need to vary the gap A of the variable capacitors.

M6*c* and M7*c* are used to condition the signal ngate_vc, which enables/disables NMOS switch M1*c*. When M1*c* (NMOS) is turned on, M7*c* (PMOS) is activated by row_en_barc, a high-voltage signal. To turn M1*c* on, the gate of M1*c* is driven to a full high voltage vpp. To turn M1*c* off, instead of driving the gate of M1*c* to 0 V, which would inject maximum coupling noise, the gate of M1*c* is only driven to vref by M6*c*. Because the source of M1*c* is at vref, a gate voltage of vref is the minimum voltage required to fully turn M1*c* off. Using a PMOS device for M6*c* has the added benefit of smoothing out the voltage slope on ngate_vc, which reduces charge injection in M1*c* due to channel charge.

Simulations which were run to test the above embodiments used a 10 fF load capacitance on the drain of the MOS switch to represent the capacitive load presented by the MEMS actuator. The results for the first and second embodiments are respectively depicted in FIGS. 4A–4C and 5A–5C. All simulations use a Vref of 5V and Vpp of 9V. The circuit shown in FIG. 2 (that is to say, the PMOS switch) was simulated to demonstrate the advantageous effects of M6*b* and M6*c* on charge injection.

Figure 4A:
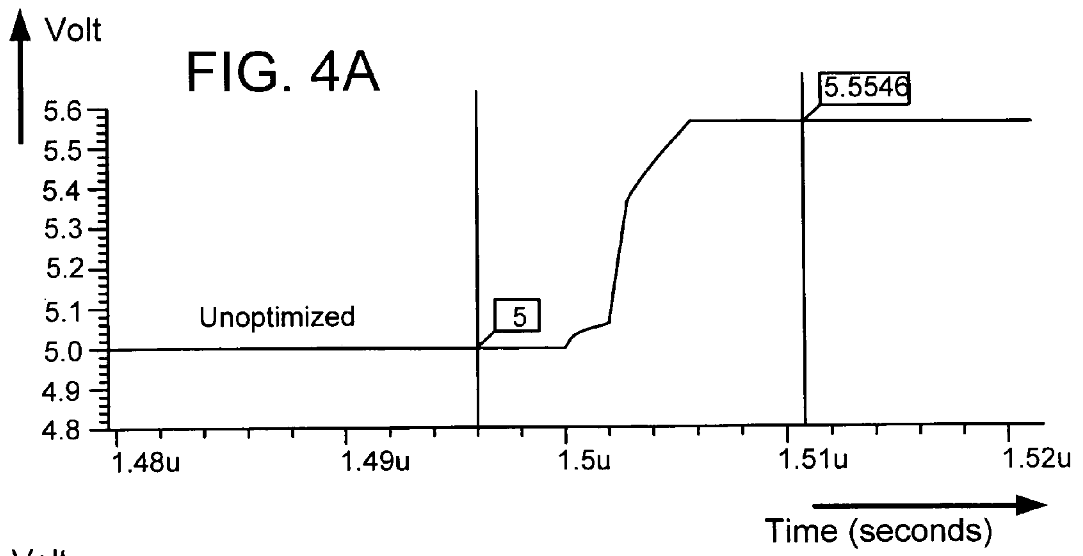
FIGS. 4A–4C graphically depict operational characteristics of the circuit arrangement shown in FIG. 2 (first embodiment).
Figure 4B:
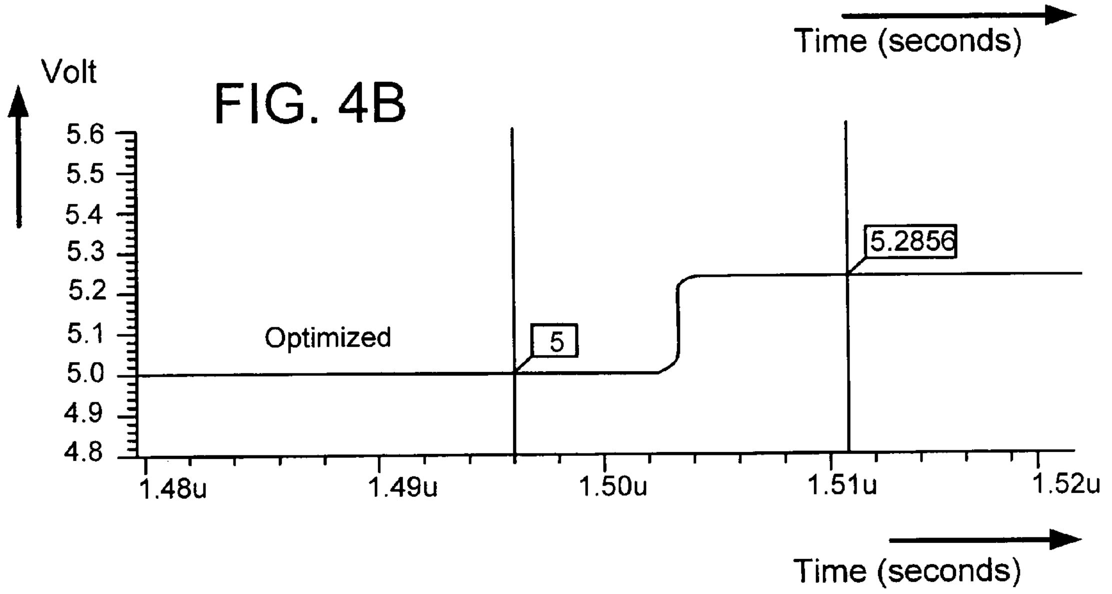
Figure 4C:
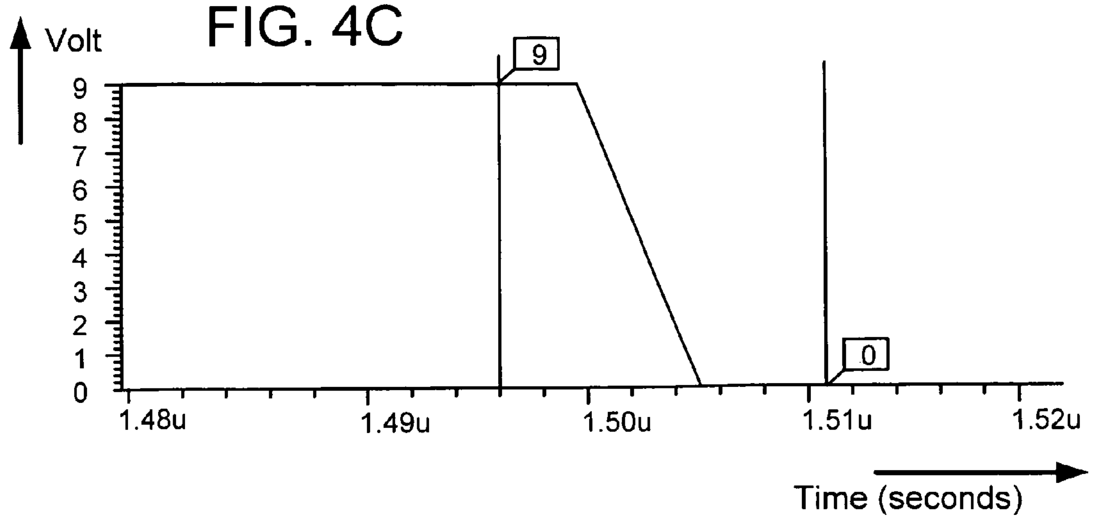

In the graphs depicted in FIGS. 4A–4C, each of the traces labeled "Unoptimized" is a trace of the waveform of the drain of the PMOS switch, the gate of which is driven directly by the bottom waveform (or its complement, in this case). The "optimized" waveform uses the extra devices M6*b* and M7*b* to limit the voltage swing on the gate of the PMOS switch. In the unoptimized case, 5.546 fC (femto Coulomb) are (by way of example) injected onto the capacitive load. In the optimized case, only 2.856 fC (by way of example) are injected onto the capacitive load.

The circuit of FIG. 3 (NMOS switch) was simulated to demonstrate the advantageous effects of M6*b* and M6*c* on charge injection. The results are depicted graphically in FIGS. 5A–5C.

Figure 5A:
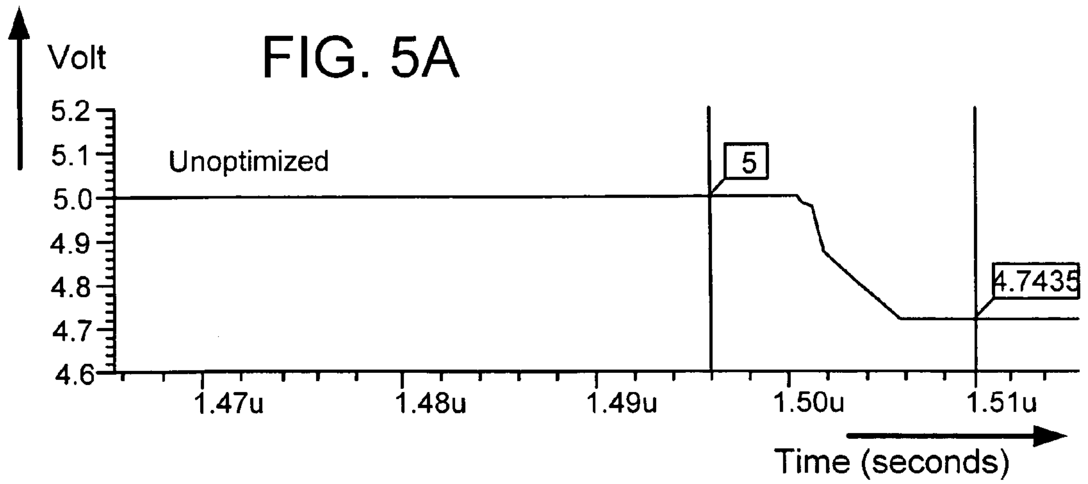
FIGS. 5A–5C graphically depict the operational characteristics of the circuit arrangement shown in FIG. 3 (second embodiment).
Figure 5B:
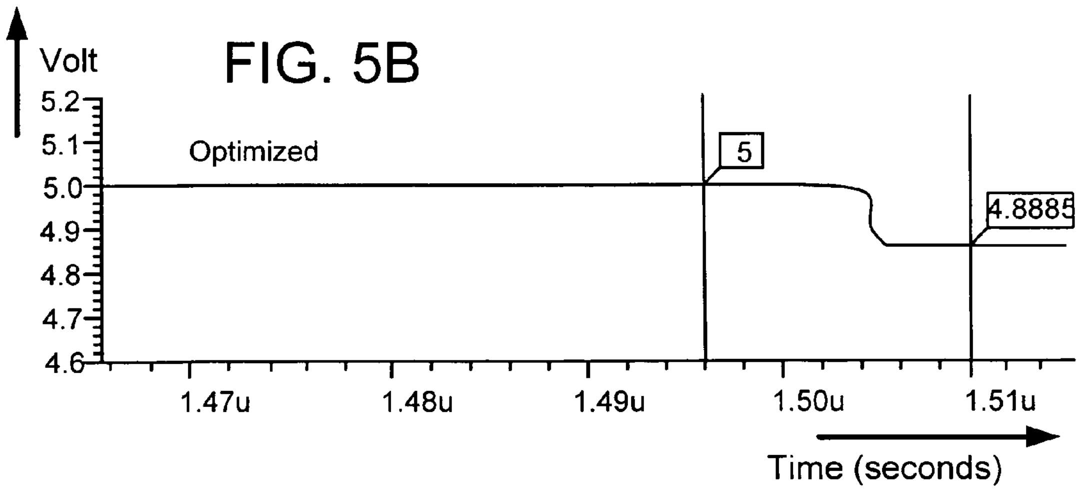
Figure 5C:
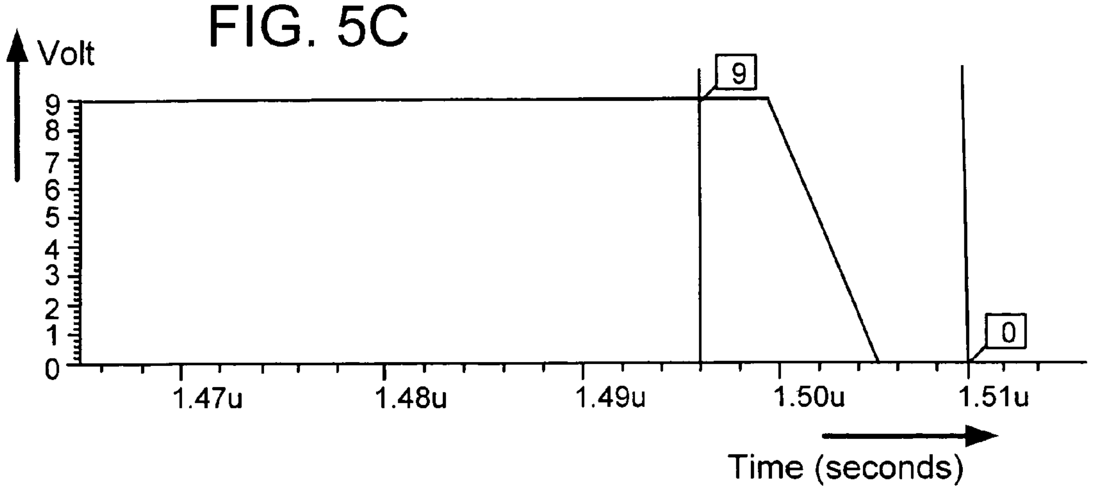

The waveform labeled "Unoptimized" in FIG. 5A is a trace of the waveform of the drain of the NMOS switch, the gate of which is driven directly by the waveform shown in FIG. 5C. The "optimized" waveform (FIG. 5B) uses the extra devices M6*b* and M7*b* to limit the voltage swing on the gate of the NMOS switch. In the unoptimized case, 2.565 fC are injected onto the capacitive load. In the optimized case, only 1.115 fC are injected onto the capacitive load.

FIG. 6 shows a third embodiment of the charge injection control circuit. This embodiment is directed limiting both "on" and "off" gate voltages to the MOS switch and includes the addition of two devices and one or two reference voltages to each array subcircuit. The reference voltages can be common to the entire array and the embodiment utilizes a PMOS analog switch.

In FIG. 6, the reference voltages v_gate_off and v_gate_on can be set depending on the range of voltages that will be used for vref. For example, v_gate_on could be set to approximately one volt below the minimum vref, and v_gate_off could be set to approximately the maximum vref, thus ensuring that the accumulation charge (when M1*d* is off) and inversion charge (when M1*d* is on) are minimized.

The operation of the circuit shown in FIG. 6 was verified using the same set of conditions as were used in FIGS. 4 and 5. FIG. 7 shows simulation results from the circuit of FIG. 6. The bottom waveform is row_end, the middle waveform is ngate_vd, and the top waveform is the voltage on C1*d*.

Figure 7A:
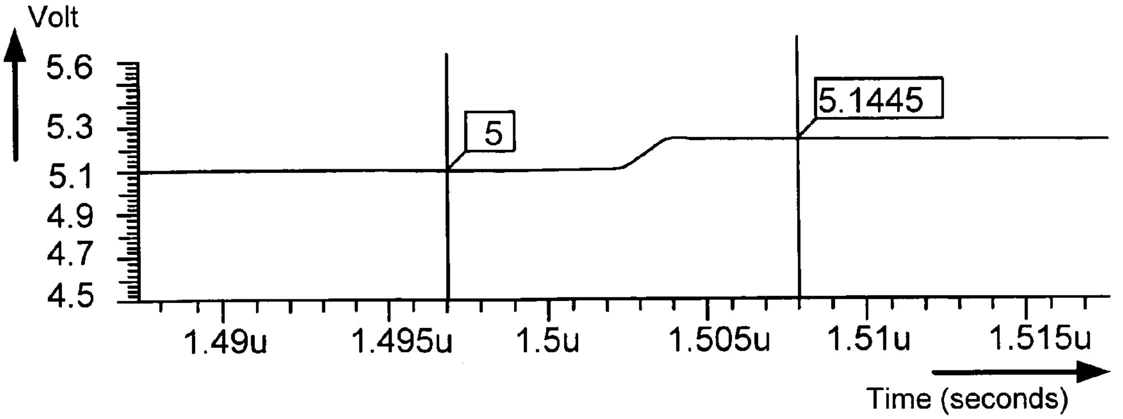
FIGS. 7A–7C graphically depict operation characteristics of the circuit arrangement shown in FIG. 6 (third embodiment).
Figure 7B:
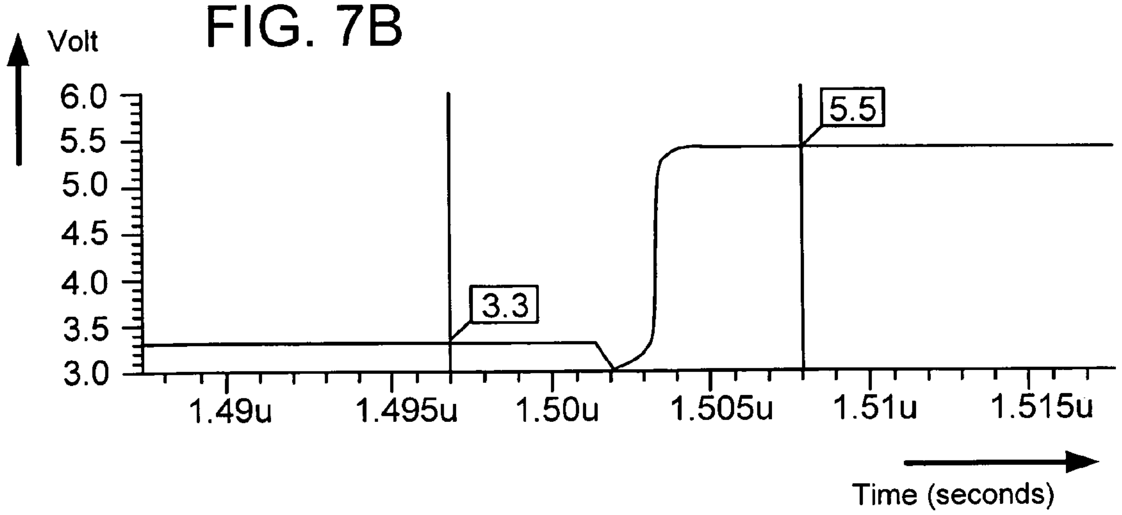
Figure 7C:
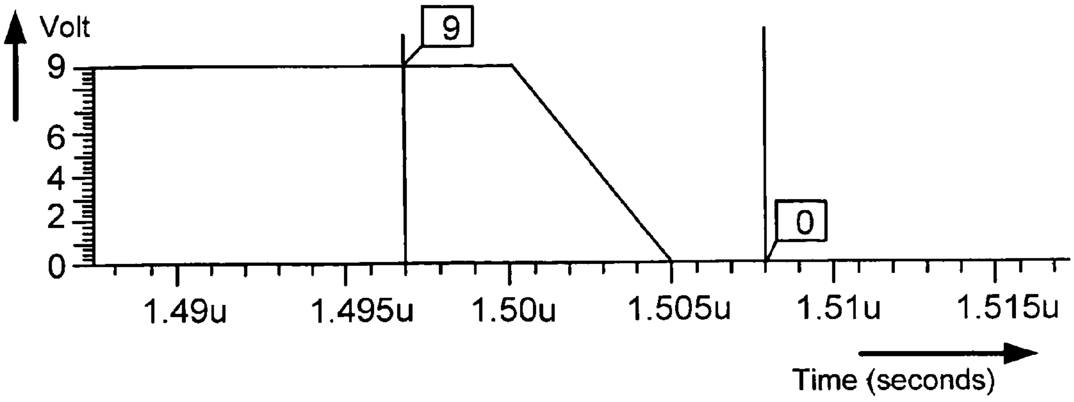

The results of FIG. 7A can be compared with those of the unoptimized case of FIG. 4A. In the unoptimized case, 5.546 fC (by way of example) are injected onto the capacitive load (see FIG. 4). In the optimized case of FIG. 7B, 1.445 fC (by way of example only) are injected onto the capacitive load.

Figure 8:
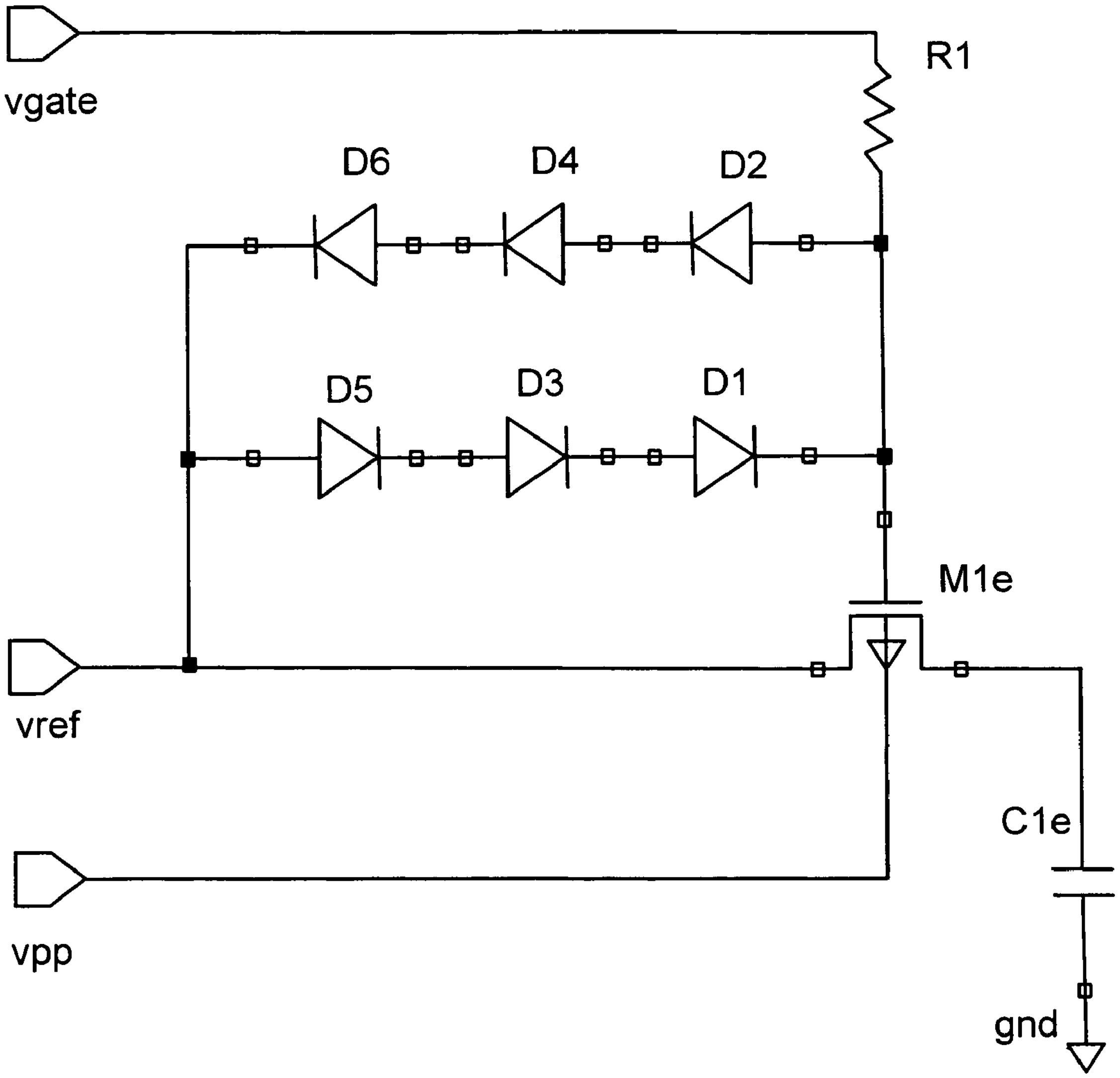
FIG. 8 is a circuit diagram of a fourth embodiment of the injection control circuit which includes one or more diodes in each array of sub-circuit and which limits the “on” and “off” gate voltages of the MOS switch.

FIG. 8 shows a fourth embodiment of the invention which requires the addition of one or more diodes to each array sub circuit, as well as a resistor which may be implemented using an active device such as an NMOS or PMOS. This embodiment limits the "on" and "off" gate voltages of the MOS switch. In the case of a PMOS switch, the gate voltage of the switch can be limited to an acceptable range around vref by means of the circuit shown in this figure.

Note that the series diodes can be replaced by a single diode designed to have an appropriate VT, or a Zener diode, or some other number/combination of diodes. It may be desirable to limit only the "on" gate voltage or only the "off" gate voltage, in which case D<2, 4, and 6> or D<1, 3 and 5> may be unnecessary. The resistor in R1 may be realized using a MOS device in order to minimize the area consumed. The resistance should, however, be sufficiently large to minimize static current flow.

Figure 9A:
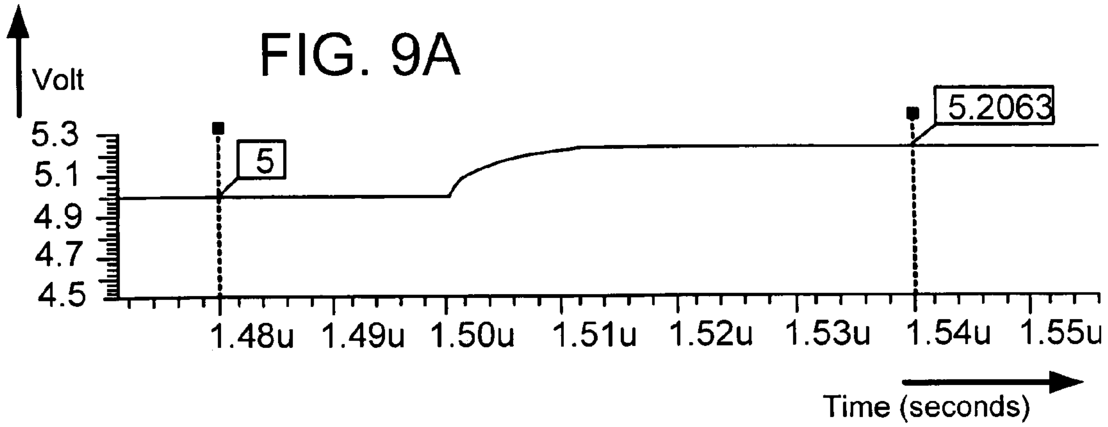
FIGS. 9A–9C graphically depict the operation characteristics of the circuit arrangement shown in FIG. 8 (fourth embodiment) on charge injection.
Figure 9B:
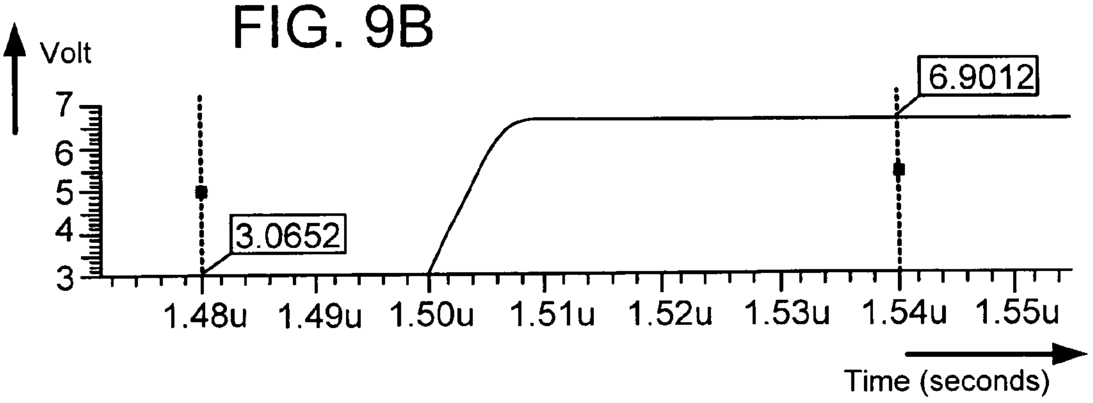
Figure 9C:
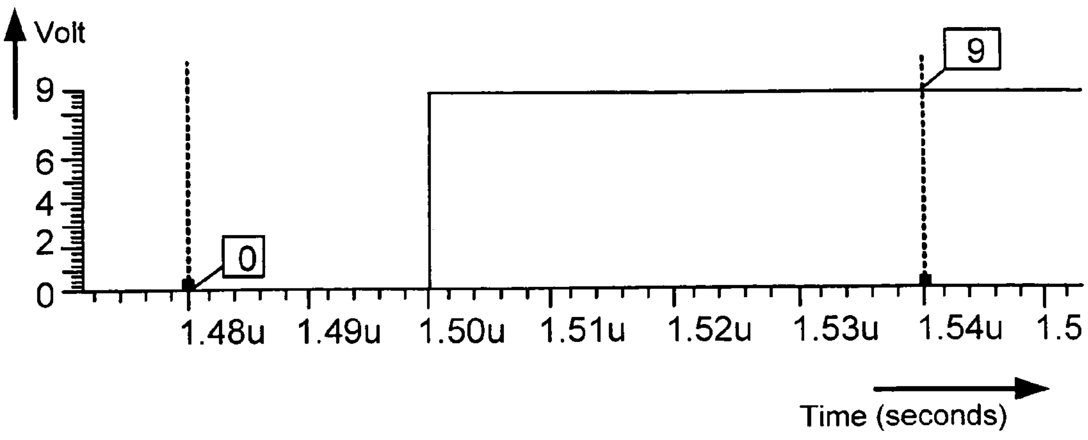

The results shown in FIG. 9 are compared with the unoptimized case of FIG. 4A. In FIG. 9C, the trace is vgate (0–9 V digital), the middle trace (FIG. 9B) is the voltage of the gate of the PMOS device, and the trace shown in FIG. 9A is the voltage on the 10 fF load capacitance.

The results of FIG. 9A are compared with those of the unoptimized case of FIG. 4A. In the unoptimized case, 5.546 fC (by way of example) are injected onto the capacitive load (see FIG. 4A). In the optimized case of FIG. 9A, 2.063 fC are injected onto the capacitive load.

With the embodiments of the invention, by decreasing the magnitude of the swing of the gate voltage of a MOS switch, charge error resulting from charge injection when the MOS switch turns off is minimized. The schematics described in connection with the preceding embodiments merely provide a few examples of circuits that can perform this function. The circuits described above can be replicated at each array sub circuit, or they can be replicated only once per row (or column) to condition row/column control signals. Note that these embodiments need not be used alone and can be used in conjunction with other methods of reducing charge injection, such as increasing turn-off time on the gate of the MOS switch, and using complimentary MOS switches.

The next embodiment is directed to reducing charge injection in control of MEMS electrostatic actuator arrays by increasing MOS switch turn-off time.

As noted above, when MOS switches turn off, charge errors occur by two mechanisms. The first is due to channel charge, which must flow out from the channel region of the transistor to the drain and source junctions. The second charge is due to overlap capacitance between the gate and drain.

When a MOS transistor turns off, the accumulated channel charge exits to the source node and the drain node under capacitive coupling and resistive conduction. Under fast switching-off conditions, the transistor conduction channel disappears very quickly since there is insufficient time for the charge at the source node and the charge at the drain node to communicate. Hence, the percentage of the charge injected into the data-holding node approaches 50 percent independent of the ratio of source capacitance to drain capacitance. However, under slow switching-off conditions, the communication between the charge at the source node and the charge at the drain node is so strong that it tends to make the final voltages at both sides equal. This allows the majority of channel charge to go to the node with larger capacitance.

As noted above, in the case of an array of MEMS actuators, the die can consist of control circuitry which runs at low-voltage logic on the periphery of the array, and the array itself, which may be required to operate at higher voltages. In this case, each En row signal may be voltage level-shifted from a low voltage (5 V, for example) output from the control logic to a high-voltage (12 V, for example) signal appropriate for the array by means of a conventional high-voltage level shifter circuit such as that shown in FIG. 10. In this example, semiconductor elements M10*a*–M10*f* are connected between terminals vpp, In and gnd, and Out and Out_Bar, in the illustrated manner. Inasmuch as voltage level shifting circuits are well known in the art and in that a number of variations can be used, no further disclosure will be given with respect to the construction, arrangement and operation of this circuit for the sake of brevity.

Figure 10:
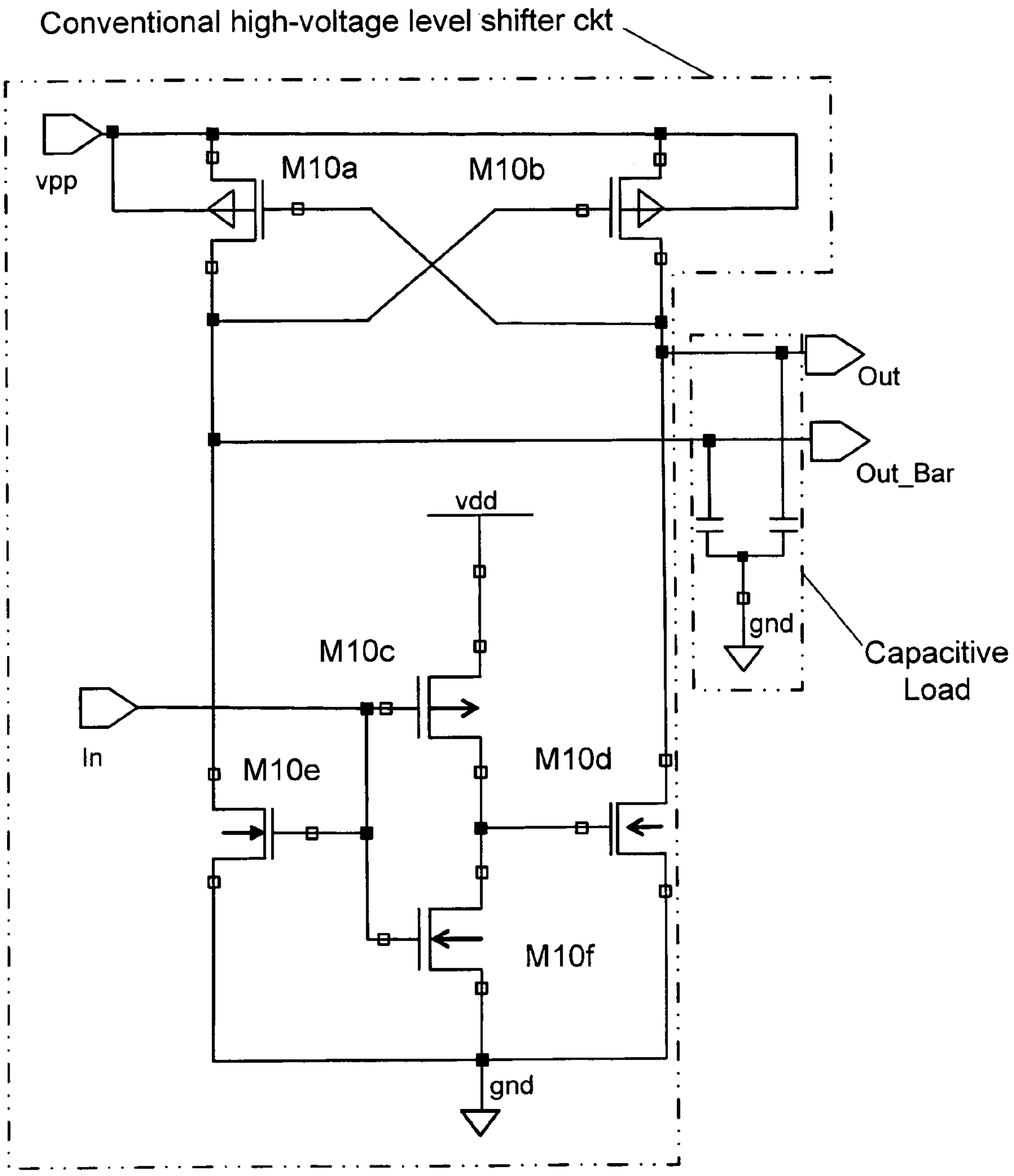
FIG. 10 is a circuit diagram which shows an example of a modified level shifter circuit which comprises an embodiment of the invention and which can be used with the other embodiments.

With the level shifting circuit shown in FIG. 10, Out or Out_Bar, for example, could be used as the row control signal En. However, in the case where control of the array is purely digital and when it is desired to operate control of the array at maximum clock rates, this level shifter circuit will normally be designed to minimize rise and fall times on the outputs. Therefore, in an effort to minimize charge injection into each MEMS device, the circuit of the FIG. 10 is modified to increase rise and fall times on Out and Out_Bar. This is done by decreasing W/L of selected ones of M10*a*–M10*f*, and/or adding a capacitive load to Out and Out_Bar in the manner shown.

Figure 11A:
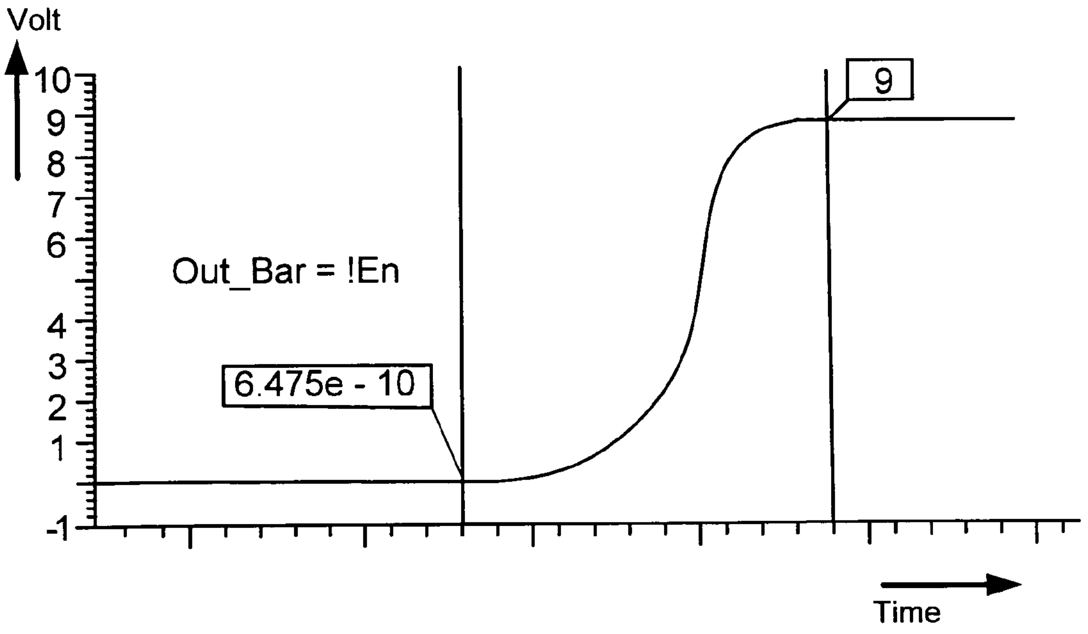
FIGS. 11A and 11B are graphs which show operation characteristics of an unoptimized level shifter circuit of the type shown in FIG. 10.
Figure 11B:
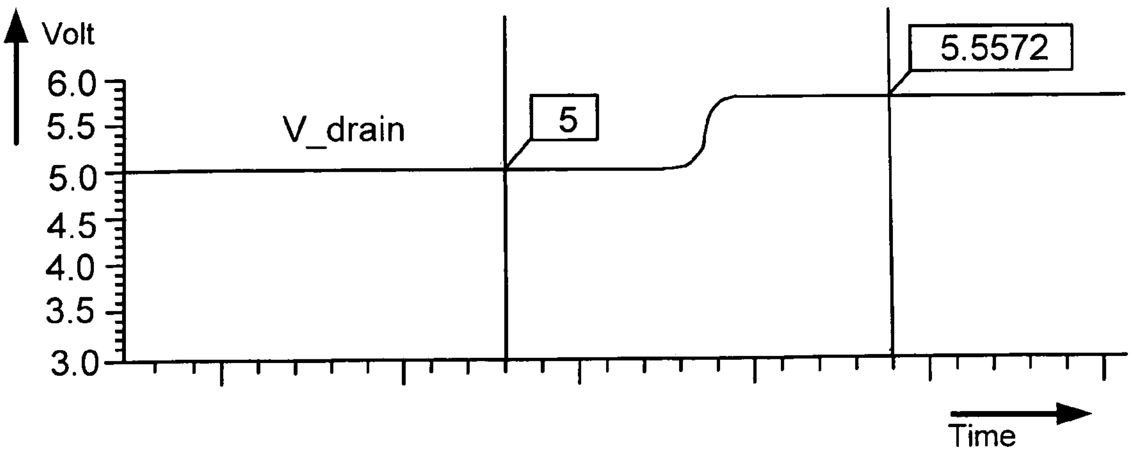

The charge injected by a PMOS switch (e.g. M1) was monitored by monitoring the voltage on a small (10 fF) capacitive load on the drain of the switch, the gate of which was connected to the output of the unoptimized level shifter in FIG. 10. FIG. 11B shows the charge injected into the drain of the PMOS switch, the gate of which was connected to the output of the unoptimized level shifter, assuming the circuit is running at 9 V and V_ref is 5 V in the manner depicted in FIG. 11A.

The charge injected by a PMOS switch (e.g. M1) was monitored by monitoring the voltage on a small (10 fF) capacitive load on the drain of the switch, the gate of which was connected to the output of the unoptimized level shifter of the type shown FIG. 10 but without the capacitance load. FIG. 11B shows the charge injected into the drain of the PMOS switch, the gate of which was connected to the output of the unoptimized level shifter, assuming the circuit is running at 9 V and V_ref is 5 V in the manner depicted in FIG. 11A.

Figure 12A:
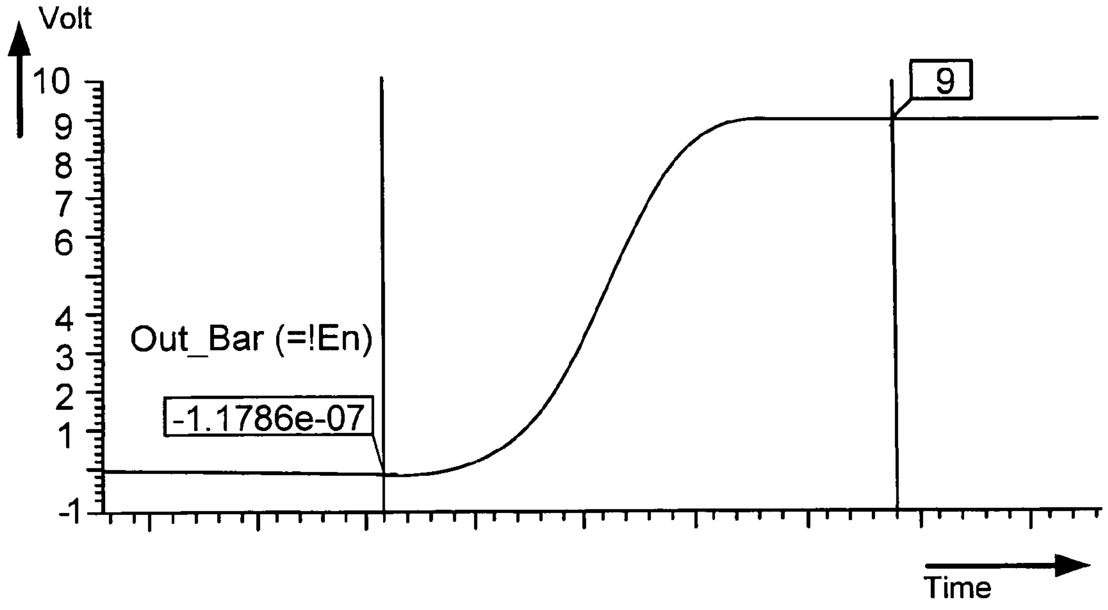
FIGS. 12A and 12B are graphs which show operation characteristics of a level shifter circuit modified in the manner illustrated in FIG. 10.
Figure 12B:
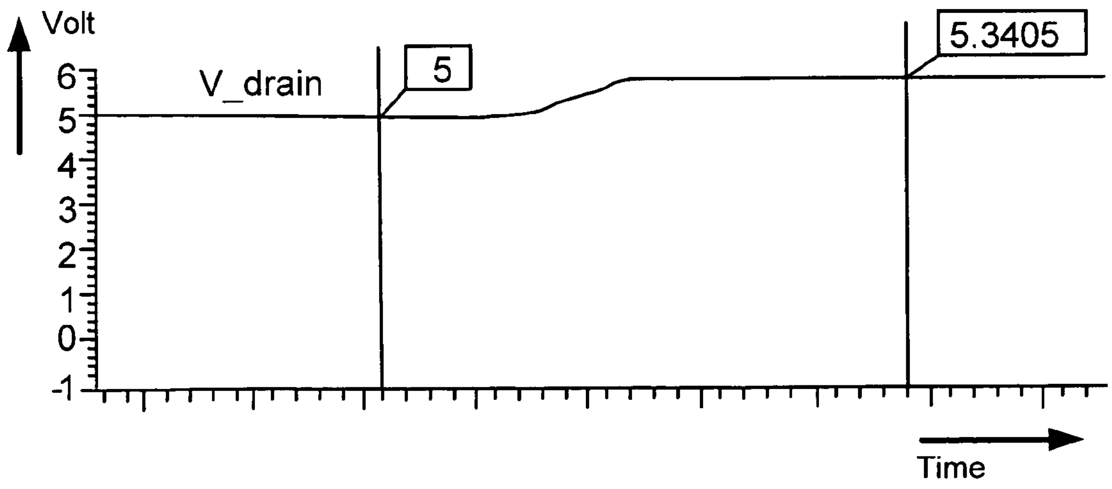

As the PMOS switch (M1) arrangement turns off, the charge injected onto the drain of the switch raises the voltage on the capacitor by 557.2 mV, which correlates to 5.572 fC, given the 10 fF load. In FIG. 12B, there are two modifications made to the conditioning of the En signal that turns the PMOS switch on and off: (a) W/L of the drivers in the level shifter are decreased, and (b) a 2 pF capacitive load was added to the En signal. The 2 pF capacitive load added to the V_ref signal, allowed the majority of the channel charge to leave via the source of the switch, since the source capacitance is much greater than the drain capacitance. It is worth noting at this point that the 2 pF load added to the vref signal (source of the MOS switch) is the parasitic capacitance inherent in running a V_ref over a large array. The drain of the MOS switch is only connected to the associated MEMS device, so capacitance on that node is quite small.

As the PMOS switch turns off, the charge injected onto the drain of the switch raises 340.05 mV, which correlates to 3.4005 fC, given the 10 fF load. This represents a 1.6× improvement in minimization of charge injection.

Thus, by increasing the time it takes for an analog MOS switch to turn off, charge injected into the drain due to channel charge accumulation can be decreased. With short turn-off times, channel charge is split approximately equally between the source and drain. With longer turn-off times achieved by weakening signal drivers and adding capacitive loads, and with the MOS switch source capacitance (capacitance on reference voltage) much greater than the MOS switch drain capacitance, the voltage between source and drain of the MOS switch is equalized, resulting in most channel charge exiting the channel out of the source terminal.

Thus, as will be appreciated, injection noise can be reduced by either:

1) reducing the amount of channel charge, 2) increasing the ratio of channel charge dumped between the source and drain by lowering the gate slew rate and increasing the source to drain node capacitance ratio, or 3) partially compensating the channel charges by using both N and P devices on the variable capacitor node.

The latter method, however, tends to suffer from a drawback of essentially doubling the parasitic capacitance on the variable capacitor node. Reduction of this capacitance is essential for increasing the stable gap range before snapdown when operating the MEMS actuator in charge control mode. It should be noted that in a voltage control mode, a smaller stable gap range is available, but maximizing the capacitance can be beneficial.

If injection charge (partition noise) can be reduced so that only one device is necessary, the use of both N & P compensating devices is not necessary and the drain capacitance can be reduced by about half.

Although not shown, the injection control circuit embodiments of the invention can be applied to controlling a micro-electromechanical system (MEMS) which combine mechanical devices, such as mirrors and actuators, with electronic control circuitry for controlling the mechanical devices. Merely by way of example, one such MEMS arrangement can comprise a diffractive light device (DLD), wherein the variable capacitor is composed of a fixed reflective ground plate and a semi-transparent, (electrostatically) movable second plate. The variable gap between the plates is used to produce interference or diffraction of light passing thereinto, and can be used for spatial light modulation in high resolution displays and for wavelength management in optical communication systems. By controlling the gap between the fixed and movable plates of the variable capacitor shown in FIG. 1, and thus using the variable capacitor as a linear acting motor, it is possible that the above mentioned interference/diffraction can be controlled.

The precision of this control is enabled by the injection control circuits which are disclosed in connection with the embodiments of the invention.

As will be appreciated, the invention has been disclosed with reference to only a limited number of embodiments, however, the various changes and modifications which can be made without departing from the scope of the invention which is limited only by the appended claims, will be self-evident to those skilled in the art of or circuit design or that which closely pertains thereto.

For example, while the above disclosure refers to slowing down the lever shifter, it is within the scope of the present invention to slow down at least one of the row and column drivers. That is to say, the technique used in the above example of the level shifter can be applied to other types of row and column drivers such as CMOS inverters and the like.

What is claimed is:

1. A control circuit for a MEMS (Micro-Electro-Mechanical System) comprising:

a variable capacitor having a fixed plate and movable plate disposed in predetermined spatial relationship with respect to the fixed plate;

a semiconductor switch which has a source, a drain and a gate, which is associated with a selected one of the fixed and movable plates of the capacitor and which is arranged to selectively connect the selected one of the fixed and movable plates with a voltage source; and a charge injection control circuit associated with the semiconductor switch which attenuates current injection into the selected one of the fixed and movable plates of the capacitor.

2. A control circuit as set forth in claim 1, wherein the charge injection control circuit comprises:

first and second semiconductor elements which are circuited with a gate of the semiconductor switch and which modify a gate signal which is applied to the gate of the semiconductor switch in a manner wherein at least one of:

a) a voltage variation time of the gate signal is set so that accumulated charge can predominantly drain from a channel of the semiconductor switch to the source when the semiconductor switch is closing, and b) the voltage of the signal which is applied to the gate is limited to limit the degree to which the semiconductor switch enters into an inversion region and/or an accumulation region.

3. A control circuit as set forth in claim 2, wherein the first and second semiconductor elements are first and second MOSFET transistors wherein the drains are both connected to the gate of the semiconductor switch and wherein the sources are respectively connected to a source of reference voltage and ground respectively.

4. A control circuit as set forth in claim 3, wherein the first and second MOSFET transistors have gates which are respectively connected with sources of signals which respectively control the opening and closing of the semiconductor switch.

5. A control circuit as set forth in claim 2, wherein the first and second semiconductor elements are third and fourth MOSFET transistors wherein drains of the third and fourth MOSFET transistors are both connected to the gate of the semiconductor switch and which have sources which are respectively connected to a source of reference voltage and a source of a predetermined high voltage.

6. A control circuit as set forth in claim 5, wherein the third and fourth MOSFET transistors have gates which are respectively connected with sources of signals which respectively control the opening and closing of the semiconductor switch.

7. A control circuit as set forth in claim 6, wherein the first and second semiconductor elements are fifth and sixth MOSFET transistors wherein drains of the fifth and sixth MOSFET transistors are both connected to the gate of the semiconductor switch wherein the sources of the fifth and sixth MOSFET transistors are respectively connected sources of voltage which are limited to respectively limit the degree to which the semiconductor switch enters into an inversion region and/or an accumulation region.

8. A control circuit as set forth in claim 2, wherein the first and second semiconductor elements are first and second diodes which are connected in parallel between a source of reference voltage and the gate of the semiconductor switch which is connected with a voltage source which controls the opening and closing of the semiconductor switch via a resistor.

9. A control circuit as set forth in claim 8, wherein the first and second diodes are configured to permit current flow in opposite directions.

10. A control circuit as set forth in claim 1, wherein the charge control circuit comprises a capacitance load which is circuited in parallel with the gate of the semiconductor switch.

11. A control circuit as set forth in claim 10, wherein the capacitance load is interposed between the gate of the semiconductor switch and a voltage control circuit which controls the application of a voltage signal to the gate of the semiconductor switch.

12. A control circuit as set forth in claim 11, wherein the voltage control circuit comprises a voltage level-shifter circuit.

13. A control circuit as set forth in claim 12, wherein the voltage level-shifter circuit is connected with a voltage source having a first voltage level and a source of a control signal which has a voltage lower than the first voltage and which determines the opening and closing of the semiconductor switch and wherein an output of the voltage level-shifter circuit is connected with the capacitance load.

14. A control circuit as set forth in claim 1, further comprising a capacitance load which is interposed between the charge injection circuit and a voltage level-shifter circuit which is configured to step up a first voltage of a control signal to a second higher voltage.

15. A display device comprising:

a plurality of variable capacitors each having a fixed plate and a movable plate disposed in predetermined spatial relationship with respect to the fixed plate;

a plurality of semiconductor switches each associated with a selected one of the fixed and movable plates of the capacitors and which is arranged to selectively connect the selected one of the fixed and movable plates with a voltage source; and a plurality of charge injection control circuits each associated with a semiconductor switch for attenuating charge injection into the selected one of the fixed and movable plates of the respective capacitor when the semiconductor switch is closing.

16. A display as set forth in claim 15, wherein the movable plate is at least partially transparent and the fixed plate is reflective so that light can be subjected to interference or diffraction in accordance with the variable distance between the fixed and movable plates.

17. A display as set forth in claim 15, wherein the plurality of charge injection control circuits each comprise:

first and second semiconductor elements which are circuited with a gate of a semiconductor switch, and which modify a gate signal which is applied to the gate in a manner wherein at least one of:

a) a voltage variation time of the gate signal is set so that current can predominantly drain from a channel of the semiconductor switch to the source when the semiconductor switch is closing, and b) the voltage of the signal which is applied to the gate has a voltage close to and in excess of a threshold voltage at which a conduction state of the semiconductor switch is changes.

18. A method of making a control circuit for a MEMS (Micro-Electro-Mechanical System) comprising:

forming a variable capacitor having a fixed plate and movable plate disposed in predetermined spatial relationship with respect to the fixed plate;

forming a semiconductor switch which has a source, a drain and a gate, which is associated with a selected one of the fixed and movable plates of the capacitor and which is arranged to selectively connect the selected one of the fixed and movable plates with a voltage source;

forming a circuit associated with the semiconductor switch for attenuating current injection into the selected one of the fixed and movable plates of the capacitor, said circuit comprising:

first and second semiconductor elements which are circuited with a gate of the semiconductor switches and which modify a gate signal which is applied to the gate in a manner wherein at least one of:

a) a voltage variation time of the gate signal is set so that current can predominantly drain from a channel of the semiconductor switch to the source when the semiconductor switch is closing, and b) the voltage of the signal which is applied to the gate is limited to limit the degree to which the semiconductor switch enters into an inversion region and/or an accumulation region.

19. A control circuit for a MEMS (Micro-Electro-Mechanical System) comprising:

variable capacitor means having a fixed plate and movable plate disposed in predetermined spatial relationship with respect to the fixed plate, for operative association with and motivating an arrangement associated with the MEMS;

semiconductor switch means which has a source, a drain and a gate, which is associated with a selected one of the fixed and movable plates of the capacitor for selectively connecting the selected one of the fixed and movable plates with a voltage source and for inducing a change in distance between the fixed and movable plates;

circuit means associated with the semiconductor switch for attenuating current injection into the selected one of the fixed and movable plates of the capacitor.

20. A control circuit as set forth in claim 19, wherein the circuit means comprises:

first and second semiconductor elements which are circuited with a gate of the semiconductor switches and which modify a gate signal which is applied to the gate in a manner wherein at least one of:

a) a voltage variation time of the gate signal is set so that current can predominantly drain from a channel of the semiconductor switch to the source when the semiconductor switch is closing, and b) the voltage of the signal which is applied to the gate is limited to limit the degree to which the semiconductor switch enters into an inversion region and/or an accumulation region.

* * * * *